Aug. 27, 1957 F. LICHTGARN 2,804,581

SEMICONDUCTOR DEVICE AND METHOD OF MANUFACTURE THEREOF

Filed Oct. 5, 1953 3 Sheets-Sheet 1

INVENTOR.
Fred Lichtgarn

BY Mason, Kolehmainen, Rathburn & Wyss

Attorneys

Aug. 27, 1957 F. LICHTGARN 2,804,581

SEMICONDUCTOR DEVICE AND METHOD OF MANUFACTURE THEREOF

Filed Oct. 5, 1953

3 Sheets-Sheet 2

INVENTOR.
Fred Lichtgarn

BY Mason, Kolehmainen, Rathburn & Wyss
Attys

Aug. 27, 1957 F. LICHTGARN 2,804,581

SEMICONDUCTOR DEVICE AND METHOD OF MANUFACTURE THEREOF

Filed Oct. 5, 1953 3 Sheets-Sheet 3

INVENTOR.
Fred Lichtgarn
BY Mason, Kolehmainen, Rathburn & Wyss
Att'ys

United States Patent Office 2,804,581

Patented Aug. 27, 1957

2,804,581

SEMICONDUCTOR DEVICE AND METHOD OF MANUFACTURE THEREOF

Fred Lichtgarn, Chicago, Ill., assignor to Sarkes Tarzian, Inc., Bloomington, Ind., a corporation of Indiana Application October 5, 1953, Serial No. 384,230

14 Claims. (Cl. 317—235)

The present invention relates to semiconductor devices, more particularly, to semiconductor devices of the type commonly known as transistors which may be employed in the translation of electrical signals, and the invention has for an object the provision of a semiconductor device of the above described type which is of improved construction, may be readily manufactured in large quantities with uniform characteristics and possesses a relatively high efficiency in the translation of electrical signals.

Semiconductor devices of the transistor type are conventionally made by cutting up a large block of crystalline semiconductive material of the desired conductivity type and the dimensions of these blocks are necessarily large enough to permit physical handling thereof. This is true of both the point contact and junction type transistors which are now commercially available. In addition to requiring a large amount of semiconductive material, which is expensive and is available only in small quantities, these conventional structures require extremely skilled manufacturing personnel in order that the transistors are somewhat uniform in their electrical characteristics. However, even with skilled technicians, under present day methods of manufacture a relatively large percentage of transistors are rejected as not being within commercial tolerances with the result that the cost of those transistors which are within commercial tolerances is greatly increased.

Accordingly, it is another object of the present invention to provide a new and improved semiconductor device of the transistor type which may be manufactured by relatively unskilled personnel and which requires a very small amount of semiconductive material for each device.

It is a further object of the present invention to provide a new and improved semiconductor device of the transistor type wherein the electrical characteristics of the device may be readily controlled so that a substantially greater percentage of the devices are within commercial tolerances.

It is a still further object of the invention to provide a new and improved semiconductor device which has many of the advantages of the conventional junction type transistor, such as rugged construction, ability to withstand shock, high power output and the like, but which has substantially less interelectrode capacity than the conventional junction type transistor.

Briefly, in accordance with one aspect of the invention the semiconductor device comprises a base member of insulating material which is provided with suitable openings for receiving metallic pin type electrodes which form the base, emitter and collector electrodes of the device. The pin electrodes may be separately formed and treated independently of the insulating base member. In one embodiment, the emitter and collector pin electrodes are provided with head portions which are coated with a thin layer of semiconductive material of one conductivity type before being inserted into the base member. More specifically, the head portions of the emitter and collector electrodes are uniformly coated in large quantities at the same time by depositing a layer of the desired semiconductive material thereon by conventional thermal evaporation techniques within an evacuated chamber so that all electrode coatings are of uniform thickness and have substantially the same electrical characteristics. After the pin electrodes are assembled and secured in the base member, the base member is coated with a very thin layer of semiconductive material of the opposite type, this layer being deposited on a large number of base members at the same time by means of thermal evaporation so that uniform devices are obtained. The exposed layer of semiconductive material on the base member is then covered with a suitable sealing compound. The coating on the head portion of each pin electrode cooperates with the deposited layer of the opposite conductivity type to form a transistor junction, or a so-called transistor couple, which exhibits the well known transistor or rectifier effect. By connecting two transistor couples together a modified junction type transistor is provided which has much less capacity than conventional junction type transistors due to the small area of the transistor couples and the fact that the pin electrodes extend away from the same side of the semiconductive layer at right angles thereto. In an alternative embodiment, a shallow depression in the top of the base member may be filled with powdered semiconductive material of the desired conductivity type which is then heated to fusion and is permitted to cool so that a suitable crystalline layer is provided. In a further embodiment the head portions of the pin electrodes may be provided with a metallic coating of a suitable metal such as cadmium, gallium, gold or the like which when subjected to heat will diffuse into the semiconductive layer deposited on the base member so as to form transistor couples. Also, the head portions of the pin electrodes may be coated by electrochemical deposition, or by electroplating, with a suitable layer of semiconductive material of the desired conductivity type.

The invention, both as to its organization and method of operation, together with further objects and advantages thereof, will best be understood by reference to the following specification taken in connection with the accompanying drawings, in which.

Figures 1, 2, 3, 4, 5, 6, 7, 8, 9, 10, 11, 11A:
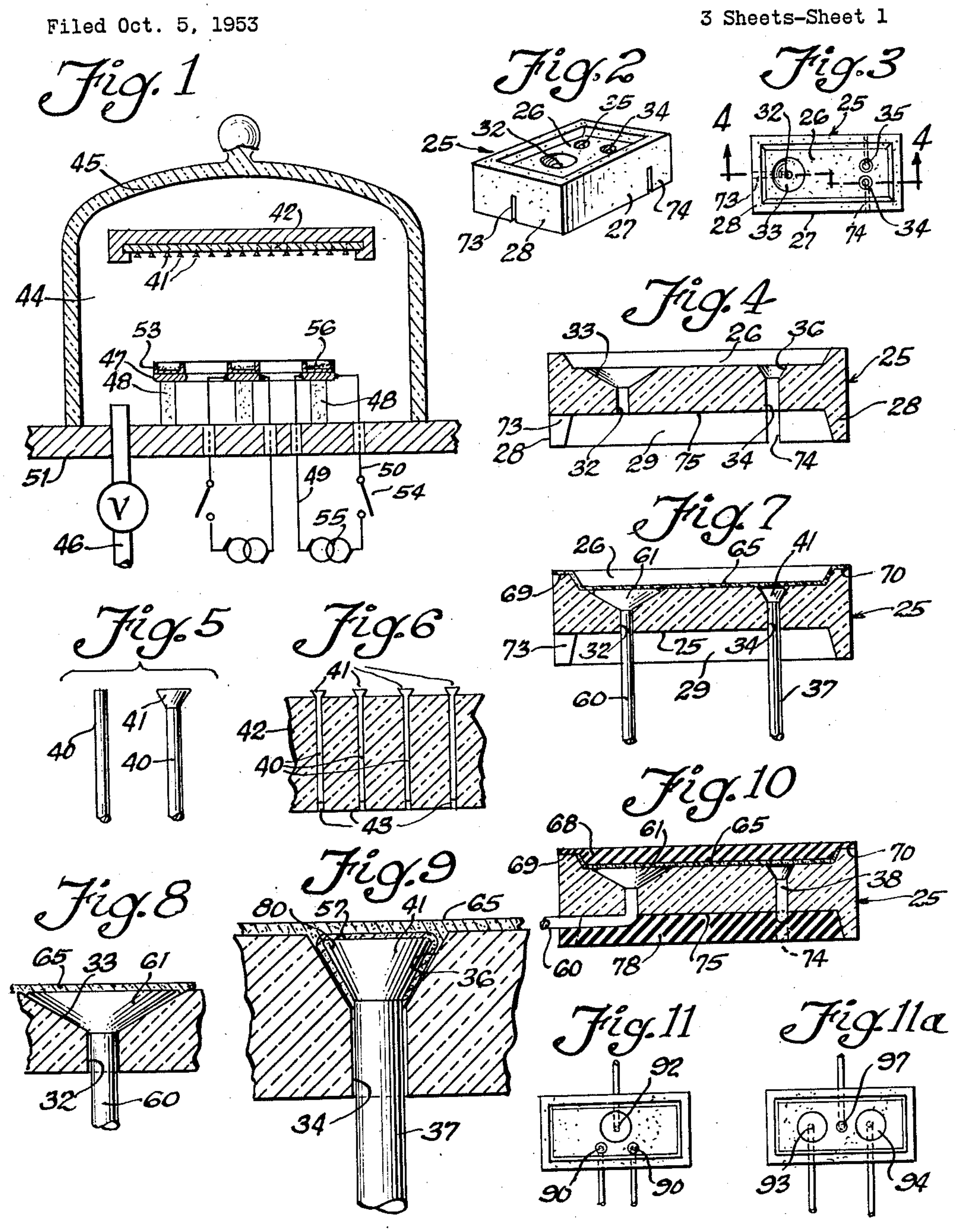
Fig. 1 shows a vacuum chamber arrangement which may be employed in producing semiconductor devices in accordance with the present invention.
Fig. 2 is a perspective view of the base member of the semiconductor device of the present invention.
Fig. 3 is a plan view of the base member of Fig. 2.
Fig. 4 is a sectional view on a somewhat larger scale taken along the line 4—4 of Fig. 3.
Fig. 5 is an elevation view of the pin type electrodes employed in the semiconductor device of the present invention showing the steps in manufacture thereof.
Fig. 6 illustrates an arrangement whereby the pin electrodes may be coated in large quantities.
Fig. 7 is a sectional view of the base member similar to that shown in Fig. 4, but on a somewhat larger scale and illustrates the manner in which the pin electrodes are positioned in the base member.
Figs. 8 and 9 are fragmentary sectional views of the base electrode and emitter electrode respectively of the unit shown in Fig. 7 and shown on a somewhat larger scale.
Fig. 10 is a sectional view similar to Fig. 7 showing the complete semiconductor device.
Figs. 11, 11A, 12 and 13 illustrate alternative arrangements of the electrodes in the semiconductor device of Fig. 7.

In order to facilitate an understanding of the following description of specific embodiments of the invention, a brief discussion of the more important terms and phenomenon described hereinafter is included herewith. Semiconduction may be classified as of two types, one known as conduction by electrons, or the excess process of conduction, and the other known as conduction by holes, or the defect process of conduction. Semiconductive materials which are suitable for utilization in the devices of this invention include germanium and silicon containing minute quantities of significant impurities which comprise one way of determining the conductivity type (either N-type or P-type) of the semiconductive material. The conductivity type may also be determined by energy relations within the semiconductor. The term N-type is applied to a semiconductive material which passes current easily when the material is negative with respect to a conductive contact thereon, whereas the term P-type is applied to a semiconductive material which passes current easily when the material is positive with respect to its conductive contact, both the N-type and P-type materials having consistent Hall and thermoelectric effects.

The expression "significant impurities" is herein employed to denote those impurities which affect the electrical characteristics of the material such as its resistivity, photosensitivity, rectifier characteristic, and the like, as distinguished from other impurities which have no apparent effect on these characteristics. The term "impurities" is intended to include intentionally added constituents as well as any which may be included in the basic material as found in nature or as commercially available. Germanium and silicon are such basic materials which, along with some representative impurities, will be noted in describing the embodiments of the present invention. Also lattice defects such as vacant lattice sites and interstitial atoms when effective in producing holes or electrons are considered as significant impurities as used in this specification.

Small amounts of impurities, such as phosphorus in silicon, and antimony and arsenic in germanium, are termed "donor" impurities because they contribute to the conductivity of the basic material by donating electrons to an unfilled "conduction" energy band in the basic material. The donated negative electrons in such a case constitute the carriers of current and the material and its conductivity are said to be of the N-type. This is also known as conduction by the excess process. Small amounts of other impurities, for example boron in silicon or aluminum in germanium, are termed "acceptor" impurities because they contribute to the conductivity by "accepting" electrons from the atoms of the basic material in the "filled band." Such an acceptance leaves a gap or "hole" in the "filled band." By interchange of the remaining electrons in the "filled band," these positive "holes" effectively move about and constitute the carriers of current, and the material and its conductivity are said to be of the P-type. The term defect process may be applied to this type of conduction.

Referring now to Figs. 1 to 10, inclusive, of the drawings, the semiconductor device of the present invention is therein illustrated as comprising a base member of insulating material, indicated generally at 25, which is provided with a shallow depression 26 in the top surface thereof. The base member 25 is also provided with the side skirt portions 27 and the end skirt portions 28 which extend downwardly from the sides of the base member 25 and define a relatively large recess 29 in the bottom surface of the base member 25. The base member 25 is of insulating material, preferably having very stable physical characteristics, for example, ceramic, porcelain, steatite, Pyrex, glass, fused silica or other suitable material which will withstand relatively high temperatures.

The base member 25 is provided with transverse openings through the central portion thereof which are adapted to receive pin type electrodes formed in accordance with the present invention. More particularly, the member 25 is provided with an opening 32 which is provided with a top opening conical portion 33 and is adapted to receive the base electrode 60 of the device, and the member 25 is also provided with a pair of openings 34 and 35 extending therethrough which are adapted to receive respectively the emitter electrode 37 and the collector electrode 38 of the device, the openings 34 and 35 having a somewhat smaller top opening conical portion 36 as is best illustrated in Fig. 4.

The pin type electrodes used in the device of the present invention may be made of invar, nickel, or other suitable metal which will withstand high temperatures, and are formed by taking a short length of relatively fine wire 40 (Fig. 5), for example #30 AWG size wire or smaller, and swedging or otherwise forming a head portion 41 on one end thereof which is adapted to fit snugly into the conical top portion of the corresponding opening in the base member 25. After the head portions 41 have been formed on the pin electrodes these head portions are in one embodiment of the invention, coated with a thin layer of semiconductive material. In order that the metallic pin electrodes may be uniformly coated so that they will have substantially identical electrical characteristics, the electrodes preferably are coated by depositing a layer of semiconductive material on the head portions thereof by means of thermal evaporation. More particularly, the formed pin electrodes are placed in a suitable holder 42 (Fig. 6) which is provided with transverse openings 43 which are adapted to receive the shank portions of the pin electrodes so that only the head portions 41 thereof are exposed.

The pin electrodes 40 may be coated in large quantities and under identical conditions by employing the apparatus shown in Fig. 1. Thus, referring to this figure, the holder 42 is positioned within a vacuum chamber 44 defined by the bell jar 45 which may be evacuated by connecting a vacuum pump to the hose connection 46.

An annular heating element 47 is supported within the chamber 45 by means of the supporting posts 48 and electrical connection to the heater unit 47 may be made through the conductors 49 and 50 which extend through the base 51 of the apparatus. An annular shallow receptacle 53, preferably of tantalum, fused silica, platinum or other suitable material, is positioned in contiguity with the heater 47 and the heater 47 may be energized by closing the switch 54 so as to connect the power source 55 thereto. Within the vessel 53 there is provided a mass 56 of semiconductive material of the desired conductivity type. For example, the mass 56 may comprise powdered N-type germanium, and when the switch 54 is closed the heater unit 47 is energized so as to bring the temperature of the N-type germanium within the vessel 53 to a value somewhat above the melting point of the germanium so that the germanium is vaporized and a thin film 57 (Fig. 9) is deposited on the head portion 41 of the pin electrodes 40. In this connection it will be understood that the germanium film 57 on the head portions 41 of the pin electrodes may be formed by other suitable methods. Thus, for example, the thin film of germanium may be formed on the head portions of the pin electrodes by means of the direct electron bombardment method as disclosed in Lewis et al. Patent No. 2,527,747 wherein the evaporated film is deposited without contamination due to the material which forms the supporting vessel. Also the germanium film may be formed by a suitable sputtering process as will be well understood by those skilled in the art. In the alternative, the head portions of the emitter and collector electrodes may be coated by means of a liquid bath electroforming treatment such, for example, as conventionally employed in the electrolytic capacitor field, in which an electric current is passed through a liquid containing the desired film forming material, one of the current electrodes being made of carbon or tantalum. A sensitive barrier layer is thus formed on the metallic surface of the head portion of the pin electrodes which completely covers this surface and is suitable for forming the desired transistor couple when the layer 65 is deposited thereon. This process will be similar to the well known "forming" operation in making electrolytic capacitors.

After the pin electrodes 40 have been coated in the manner described above they are inserted within the openings 34 and 35 in the base member 30 so that they form the emitter and collector electrodes 37 and 38 of the device, and a base electrode 60 is also inserted within the opening 32 in the base member 25. The base electrode 60 is provided with a head portion 61 which is formed in the same manner as the heads 41 of the electrodes 40, but is not coated with semiconductive material and is of relatively large area, the head portion 61 being adapted to fit into the conical opening 33 in the upper face of the base member 25. Preferably, the openings 32, 34 and 35 are of the correct diameter to provide a press fit with the shank portions of the pin electrodes so that these electrodes are held in place after they are pulled into the openings in the base member 25. In this connection it will be understood that the head portions of the pin electrodes may have any desired shape so long as the upper surface thereof is positioned in substantially the same plane as the shallow depression in the base member 25. Also, it may be desirable to provide the openings 32, 34 and 35 with a slight taper so as to secure the pin electrodes firmly within the base member. In the alternative, the shank portions of the electrodes may be provided with suitable ridges or barbs which grip the sides of the apertures in the base member and hold the pin electrode firmly in place.

After the pin electrodes have been inserted in the base member 25 a large number of these base members are clamped together in a suitable holding fixture (not shown) and a thin film 65 (Fig. 7) of semiconductive material of a positive conductivity type is deposited over the upper face of the base members including the exposed head portions of the base, emitter and collector electrodes positioned within the base member. The film 65 may be deposited by any of the methods as described above in connection with the coating of the head portions of the pin electrodes 40. In the alternative, the film 65 may be formed by depositing a small amount of powdered P-type material in the shallow depression 26 in the upper surface of the base member 25 and then heating the units to the fusion point of the P-type material so that this material is melted and forms a thin film within the depression 26 which covers the head portions of the pin electrodes in the base member 25. In this connection, it will be understood that the conductivity types of the films 57 and 65 may be reversed, i. e., the head portions of the emitter and collector electrodes may be of P-type material and the film 65 may be of N-type material.

After the film 65 is formed, the depression 26 in the base member 25 is filled with a suitable sealing compound 68 so as to seal the sensitive layer 65 from the atmosphere. In the event that the film 65 is deposited by thermal evaporation, this film will be deposited on the upper edges 69 and 70 (Fig. 7) of the base members. Preferably, the semiconductive material which is deposited on the edge portions 69 and 70 is removed by a suitable buffing or grinding operation while the units are assembled together and before the sealing compound 68 is added so that the sensitive film 65 terminates at the upper edge 72 of the shallow depression in the base member and the sealing compound extends over the edges 69 and 70 of the base member 25, as is best illustrated in Fig. 10, so that the film 65 is completely sealed from the atmosphere.

After the sealing compound 68 has been added, the units may be separated and the end portions of the pin electrodes may be bent at right angles and pulled out through suitable slots 73 and 74 which are formed in the skirt portions 27 and 28 of the base member 25, the slots 73 and 74 being of sufficient width to grip the ends of the pin electrodes and are cut deep enough to be flush with the bottom surface 75 of the central portion of the base member 25. With this arrangement the pin electrodes are further secured by wedging within the slots 73 and 74. Preferably the slots 73 and 74 are formed in the base member 25 by means of a diamond saw cutting operation which may be performed after the units are positioned in the holding fixtures so that a large number of units may be cut at the same time. After the ends of the pin electrodes have been positioned within the saw cuts 73 and 74, the bottom recess 29 of the base member 25 is filled with a suitable quick setting hard plastic 78 which fills the recess 29 and further secures the pin electrodes so as to permit subsequent handling of the unit. It will be noted that the emitter and collector pin electrodes, such as the emitter electrode 37, are provided with a rounded upper edge 80 (Fig. 9) and the layer 57 of semiconductive material extends around the sides of the head portion of the electrode so that no uncoated portion of the pin electrode is in contact with the adjacent film 65 of the opposite type semiconductive material. From the foregoing description of the semiconductor device of the present invention it will be evident that an improved structure is provided wherein relatively low capacity exists between the pin electrodes 37, 38 and 60 so that increased efficiency, particularly at the higher frequencies, is provided. Also, with the described arrangement, semiconductor devices having extremely uniform electrical characteristics may be produced on a mass production basis without employing skilled personnel since all of the coating and forming operations may be carried out by suitable automatic machinery.

While the emitter and collector electrodes have been illustrated as being coated with a layer of semiconductive material of the desired conductivity type, it will be understood that the required transistor couples may be formed by other arrangements. For example, the emitter and collector electrodes may be formed of a suitable metal, such as gold, indium, gallium, aluminum, and after the layer 65 of semiconductive material is deposited over the bare heads of these electrodes they are subjected to heat so that the metal of the electrode diffuses into the layer 65 and forms a zone of the opposite conductivity type. In this connection it will be understood that the choice of metal for the emitter and collector electrodes will be determined by the conductivity type of the layer 65. Thus, if the layer 65 is P-type germanium, the emitter and collector electrodes may be made of antimony or phosphor alloy, to obtain the desired diffusion and formation of an adjacent N-type zone, as will be readily understood by those skilled in the art. It will also be understood that by providing separate pin electrodes which may be formed and treated independently of the base member, the emitter and collector electrodes may be made of different materials or metals which are particularly adapted to perform either the emitter function or the collector function in the completed semiconductor device. In the alternative, the head portions of the emitter and collector electrodes may be coated, as by plating, dipping or the like, with a layer of the desired metal which will provide the desired opposite conductivity layer upon diffusion. However, when the transistor couple is formed by the diffusion process, it is important that the base electrode does not react with the layer 65 when subjected to heat during the diffusion process. Thus, for the diffusion process the base electrode is either formed of some metal such as tantalum, stainless steel, titanium, molybdenum, platinum, or the like, which is chemically inert to the semiconductive layer 65, or, in the alternative, the metal of the base electrode is so chosen that upon diffusion into the layer 65 a zone of the same conductivity type as the layer 65 is formed. In this connection, it will be understood that when the layer 65 is deposited by evaporation and the emitter and collector electrodes are provided with the layers 57 of the opposite conductivity type, the base electrode may be of any desired metal since the base electrode is not subjected to heat during the evaporation process. However, if the layer 65 is formed by melting powdered germanium and allowing it to cool to form the desired crystalline structure, the metal of the base electrode should be chosen as described above to avoid forming an undesired transistor couple.

After the layer 65 has been deposited, by either evaporation or by heating powdered germanium to fusion and cooling, the base member may be subjected to a further heat treatment to stabilize the electrical characteristics of the device, promote bonding of the transistor couples and diffusion effects and to enhance crystal growth. This subsequent heat treatment may be carried out in a vacuum or in a protective atmosphere of argon, helium or nitrogen. In the alternative, this subsequent heat treatment may be carried out in a reactive atmosphere, such as bromine, for example, to form a protective surface on the layer 65, attach excess impurities in the layer, provide special electrical characteristics, etc. A dry electroforming operation may be preformed either before or after the above described heat treatment to increase the rectifier action of the device. In the electroforming operation a relatively heavy pulsating current is passed through the unit for a short period of time.

Figure 12:
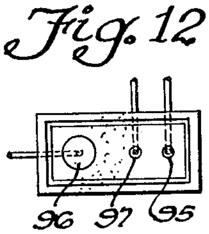
Figure 13:
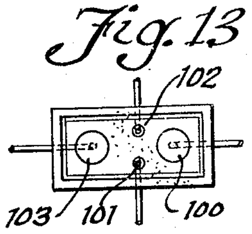
Figures 14, 16:
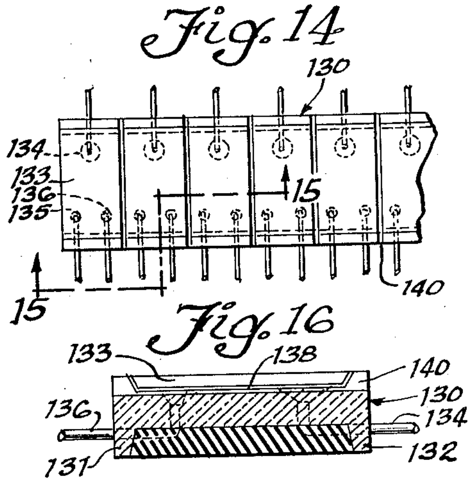
Fig. 14 is a plan view of a multiple unit semiconductor device constructed in accordance with the features of the present invention.
Fig. 16 is a sectional view taken along the lines 16—16 of the multiple unit device of Fig. 15.
Figure 15:
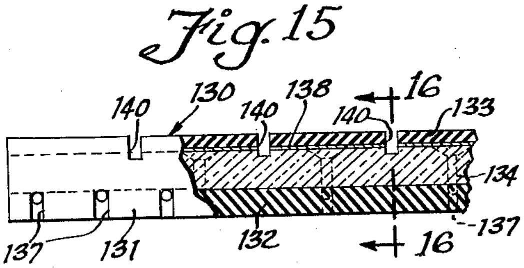
Fig. 15 is a sectional view taken along the lines 15—15 of the multiple unit of Fig. 14.

It will be understood that the positioning of the base, emitter and collector electrodes in the device shown in Figs. 2 to 10, inclusive, may be varied as desired to obtain different electrical circuit characteristics. Thus, in Fig. 11 there is shown an alternative arrangement wherein the emitter electrode 90 is positioned a relatively large distance from the collector electrode 91 and a short common path to the base electrode 92 is provided. In the embodiment shown in Fig. 11A the semiconductor device is made in two identical parts, one of which is shown in Fig. 11A as comprising a pair of base electrodes 93 and 94 which are positioned on either side of the coated electrode 97 which may be connected either as an emitter or as a collector electrode, as will be described in more detail in connection with Fig. 22. The arrangement shown in Fig. 11A permits greater emitter and collector separation with consequent reduction in capacity and advantages in circuit connections. In the embodiment shown in Fig. 12 the electrodes are positioned along the same line and the emitter electrode 95 is positioned further from the base electrode 96 than the collector electrode 97. In the embodiment shown in Fig. 13, a so-called "tetrode" arrangement is shown wherein a fourth electrode 100 is positioned relatively close to the emitter electrode 101 and the collector electrode 102 and is spaced oppositely to the base electrode 103.

Figure 20:
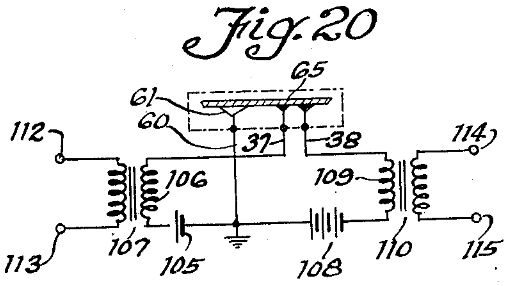
Figs. 20, 21 and 22 are electrical circuit diagrams showing the electrical circuit connections to the semiconductor devices of the invention.
Figure 22:
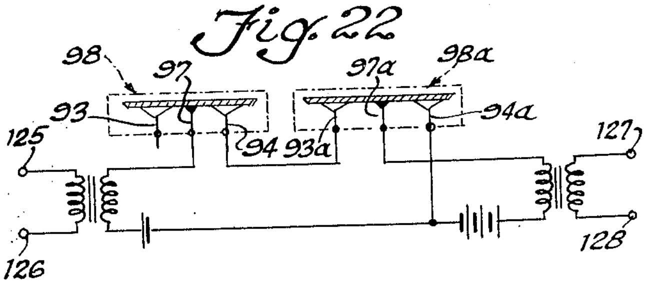
Figure 23:
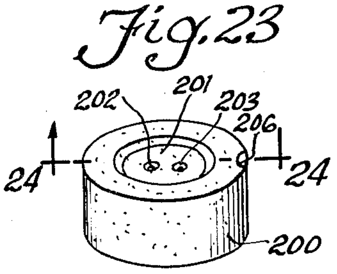
Fig. 23 is a perspective view of the base member employed in an alternative embodiment of the invention in which the semiconductor device is hermetically sealed.
Figure 24:
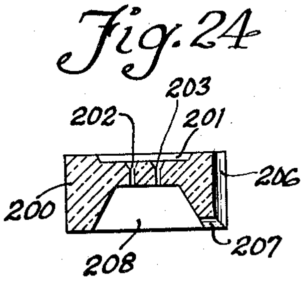
Fig. 24 is a sectional view taken along the center line of the base member of Fig. 23.
Figure 25:
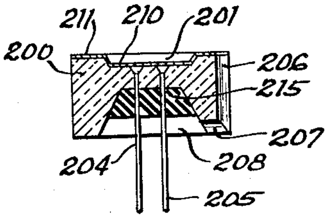
Fig. 25 is a sectional view similar to Fig. 24 and showing the completed base member unit.
Figure 26:
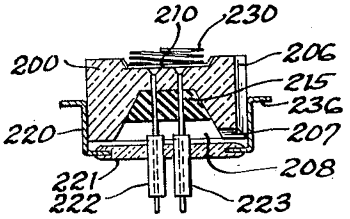
Fig. 26 is a sectional view similar to Fig. 25 and showing the lower portion of the metal casing.
Figure 27:
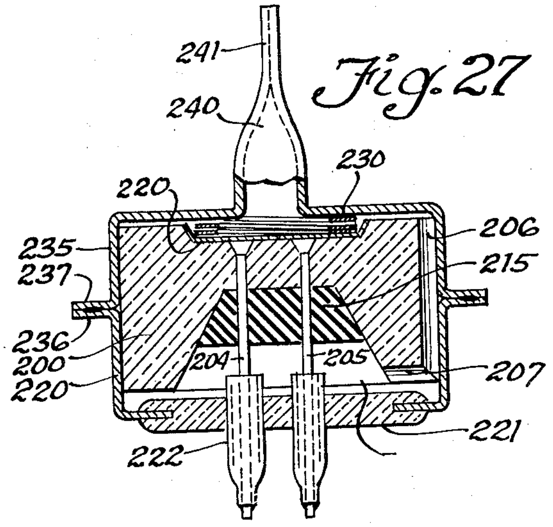
Fig. 27 is a sectional view similar to Fig. 25 but on a somewhat larger scale and showing the completely enclosed semiconductor device.
Figure 28:
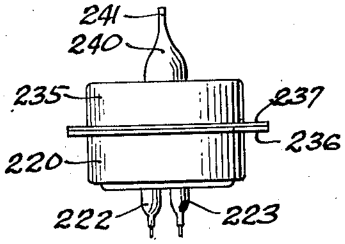
Fig. 28 is a side elevational view of the complete device.

Considering now the electrical circuit arrangements of the semiconductor devices of the present invention, reference may be had to Figs. 20 and 22, inclusive, wherein typical circuit arrangements are shown. The emitter pin electrode 37 is biased in a relatively conductive polarity with respect to the base electrode 60 by means of a suitable source of potential such as the battery 105. Thus, if the semiconductive coating on the emitter electrode 37 is of N-type material, the negative terminal of the battery 105 is grounded and the positive terminal thereof is connected through the secondary winding 106 of the input transformer 107 to the emitter electrode 37. The input signal is impressed upon the terminals 112 and 113 of the input transformer 107, the base electrode 60 being connected to ground. The collector electrode 38 is biased with respect to the base electrode 60 in a relatively nonconductive polarity by a suitable source of potential such as the battery 108. If the coating on the collector electrode 38 is of N-type material the positive terminal of the battery 108 is connected to ground while its negative terminal is connected through the primary winding 109 of the output transformer 110 to the collector electrode 38, the output signal being produced between the output terminals 114 and 115. When the emitter and collector electrodes 37 and 38 are coated with a thin layer of N-type material which is intimately bonded to the layer 65 of P-type material and the base electrode is electrically connected through the head portion 61 thereof to the layer 65, a modified form of junction type transistor is provided and an input signal applied between the terminals 112 and 113 will be repeated in amplified form across the output terminals 114 and 115 in accordance with the transistor action which occurs at the interfaces between the layer 65 and the emitter and collector layers.

Figure 21:
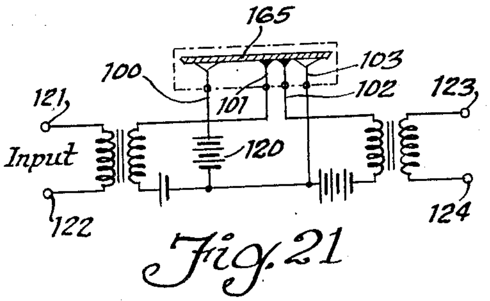

In Fig. 21 there is shown an electrical circuit arrangement of the triode unit described above in connection with Fig. 13. Thus, referring to Fig. 21, the fourth electrode 100, which is in intimate contact with the layer 65, is biased positively with respect to the base electrode 103 by means of a suitable potential source such as the battery 120, the emitter electrode 101 and collector electrode 102 being connected in a manner similar to that described heretofore in connection with Fig. 20 so that the input signal applied between the terminals 121 and 122 is repeated in amplified form across the optput terminals 123 and 124.

In Fig. 22 there is shown a typical circuit connection for the structure shown in Fig. 11A wherein the semiconductor device is divided into two parts. In this embodiment, one of the contact electrodes 94 of one unit 98 is connected to the contact electrode 93a of a similar unit 98a, the electrode 97 of the unit 98 is connected as the emitter electrode, the electrode 97a of the unit 98a is connected as the collector electrode and the contact electrode 94a of the unit 98a is connected as the base electrode of the device. These electrodes are appropriately biased as described above in connection with Fig. 20 so that an input signal applied to the terminals 125 and 126 is repeated in amplified form at the output terminals 127 and 128.

Figure 17:
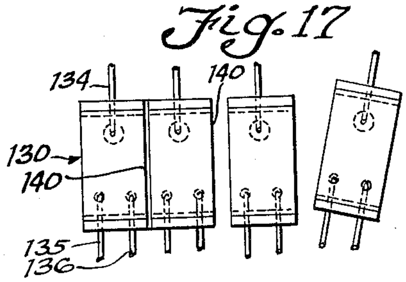
Fig. 17 is a plan view of the multiple unit of Fig. 15 showing the manner in which individual sections thereof may be separated.
Figure 18:
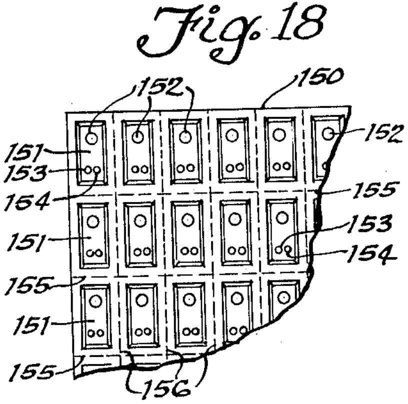
Fig. 18 is a plan view of another alternative embodiment of the invention wherein a large number of semiconductor devices may be manufactured as a unit.

In Figs. 14 to 17, inclusive, of the drawings, an alternative arrangement is shown whereby a multiple unit semiconductor device is provided in which all of the semiconductor units have substantially identical electrical characteristics. Referring to these figures, the multiple unit comprises a strip of insulating material 130 which forms the base member of the unit and is provided with the depending skirt portions 131 and 132 along the sides thereof and the longitudinally extending trough 133 (Fig. 16) in the upper surface thereof. The member 130 is provided with a row of apertures for the base electrodes 134 of the device and is provided with a row of apertures for the emitter electrodes 135 and the collector electrodes 136 of the adjacent units. The base electrodes 134, emitter electrodes 135 and collector electrodes 136 may be formed in a manner identical to that described above in connection with Figs. 2 to 10, inclusive, and are inserted in the base member 130. The end portions of these electrodes are brought out through the saw cuts 137 in the skirt portions 131 and 132 so as to secure the pin electrodes in position. After the electrodes have been inserted in the member 130 the upper surface thereof is coated with a thin layer 138 of the opposite type semiconductive material which is deposited within the trough 133. The trough 133 and the bottom recess of the member 130 are then filled with a suitable sealing compound so as to seal the layer 138 and to hold the pin electrodes in position. After the above operations are performed, the multiple unit is divided into sections by means of the slots 140 which are cut into the upper surface of the unit to a depth somewhat greater than the layer 138 so that separate semiconductor units are provided, each of which functions as an independent device although a common base member is provided. It will also be understood that individual semiconductor units may be formed from the strip type multiple unit by simply separating these units along the saw cuts 140, as shown in Fig. 17, so that individual semiconductor units which have substantially identical electrical characteristics are provided.

If desired, the semiconductor devices may be formed in a much larger group by employing the base member 150 of insulating material which is provided with rows of shallow depressions 151 for each semiconductor unit so that a grid-like surface is provided on both sides of the layer 150. Within each of the depressions 151 there are provided suitable apertures 152 for the base electrode of each semiconductor unit and the apertures 153 and 154 for the emitter and collector electrodes. Prefereably the base member 150 is of photo-sensitive glass so that all of the apertures 152, 153, 154 may be formed simultaneously in the member 150 by the method commonly known as "chemical machining." Thus, a suitable mask is positioned over the member 150 and this member is exposed to light in the areas corresponding to the apertures 152, 153 and 154 and the glass is then leached away in the areas which have been exposed to light. With this arrangement the apertures for a large number of semiconductor units may be formed in a single operation. The coated emitter and collector electrodes and the base electrodes are then inserted in each semiconductor section and the base member 150 is then coated with a semiconductive material of the correct conductivity type in the manner described above. After the depressions in the member 150 are filled with a suitable sealing compound, the member 150 may be cut along the lines 155 and 156 so as to provide either multiple or individual semiconductor units.

Figure 19:
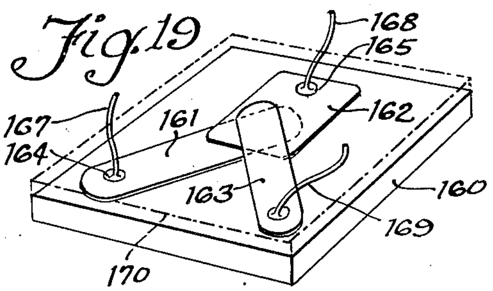
Fig. 19 illustrates a further alternative embodiment of the invention wherein a junction type semiconductor device is provided.

In Fig. 19 there is shown an alternative embodiment of the invention wherein a power type semiconductor device is provided. In this figure, a base member 160 of insulating material is provided and a layer 161 of semiconductive type is deposited on the base member 160 in a predetermined configuration by means of a suitable masking member and by employing the above described vacuum evaporation technique. After the layer 161 is deposited the second layer 162 is deposited on the plate 160 in overlapping relation to the layer 161 by means of a suitable masking member. The layer 162 is of the opposite conductivity type from layer 161. After the layer 162 has been deposited, another layer 163 is deposited on the plate 160 in overlapping relation to the layer 162, the layer 163 being of the same conductivity type as the layer 161. The deposited layers 161, 162 and 163 may then be heated to fusion and allowed to cool to provide the desired crystalline structure. After the layers 161, 162 and 163 have been deposited, suitable contact areas 164, 165 and 166 are simultaneously deposited on the outer portions of the layers 161, 162 and 163 by thermal evaporation of a suitable contact metal on these areas as controlled by a suitable masking member. The emitter lead 167 is then electrically connected to the plated area 164 by any suitable means, such as soldering, the base connection 168 is made to the area 164 in a similar manner and the collector connection 169 is also made to the area 166. After the above described electrical connections are made the entire upper surface of the unit is coated with a sealing compound 170 to a suitable depth so that all of the sensitive layers on the base member 160 are hermetically sealed and only the conductors 167, 168 and 169 extend through the sealing compound 170. It will be understood that the device of Fig. 19 is electrically connected in the conventional manner to any suitable translating circuit with the emitter element 161 and the collector element 163 correctly biased for optimum transistor action.

In Figs. 23 to 28, inclusive, of the drawings there is shown a further alternative embodiment of the invention wherein a hermetically sealed semiconductor device is provided. Referring to these figures, the base member of the device comprises a cylindrical member 200, which is preferably formed of suitable insulating material which will withstand high temperatures and is provided with a shallow depression 201 in the top surface thereof. The base member 200 is, in general, similar to the base member 25 described in detail above in connection with Figs. 2 to 10, inclusive, and includes the central openings 202 and 203 therein which are adapted to receive the emitter and collector pin electrodes 204 and 205 which are formed in the manner described above in connection with the embodiment shown in Figs. 2 to 10, inclusive. However, the base member 200 is provided with a groove 206 extending along the side of the base member 20 which communicates with the groove 207 in the bottom thereof so that the bottom depression 208 of the base member 200 may be evacuated, as will be described in more detail hereinafter.

The emitter and collector electrodes 204 and 205, which may be formed by any of the above described techniques, are positioned in the base member 200 and a layer 210 of semiconductive material of the opposite conductivity type is deposited on the upper surface of the base member 201 in intimate contact with the upper surface of the head portions of the electrodes 204 and 205. In this connection it will be understood that the pin electrodes 204 and 205 and the layer 210 may be formed by the above described evaporation technique in large numbers and under identical conditions so that uniform electrical characteristics are obtained. After the layer 210 is deposited the annular portion 211 thereof on the top surface of the base member 200 is removed by a suitable buffing operation so that the layer 210 is contained within the recess 201. A layer of sealing compound 215 is then placed in the bottom recess 208 of the base member 200 to secure the shank portions of the emitter and collector electrodes 204 and 205.

After the semiconductor device has been formed in the manner described above a metallic cup shaped member 220 is inserted over the bottom portion of the device. The cup shaped member 220 is provided with a disk-like insert 221 of suitable insulating material, such as glass, in the central portion of which there is positioned the hollow metal tubular sections 222 and 223. The tubular members 222 and 223 are adapted to receive the end portions of the pin electrodes 204 and 205 and the end portions of the members 222 and 223 are crimped around the ends of the pin electrodes and sealed by a soldering or welding operation, thereby forming the emitter and collector terminals of the device. A soft stainless steel coil spring 230 is then positioned on the layer 210 and the upper cup shaped member 235 is positioned over the upper portion of the device. The cup shaped members 220 and 235 are respectively provided with the annular flange portions 236 and 237 which may be flash welded together to seal the same. In the top portion of the member 235 there is provided a tubular portion 240 which forms the exhaust tabulation and is adapted to be connected to a vacuum pump so that the space within the sealed unit may be evacuated. In this connection it will be noted that the grooves 206 and 207 permit evacuation of the bottom recess 208 in the base member 200. After the device is evacuated, the tubular portion 240 is pinched off as indicated at 241, thereby forming the base terminal of the semiconductor device. It will be noted that the spring 230 connects the top surface of the layer 220 to the member 235 so that the pinched off portion 241 thereof is electrically connected to the layer 210 and may act as the base electrode of the device. In this connection it will be understood that the terminals 222, 223 and 241 are adapted to be connected in an electrical circuit in a manner identical to that described above in connection with Fig. 20 to provide a suitable signal translating circuit.

Figure 30:
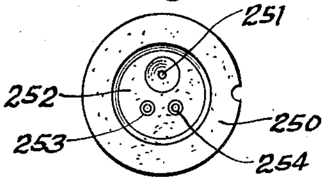
Fig. 30 is a plan view of the base member used in the alternative embodiment of Fig. 29.
Figure 29:
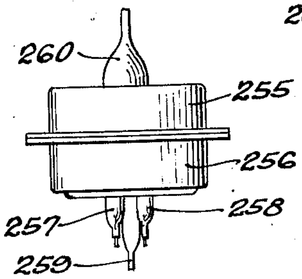
Fig. 29 is a side elevational view of another alternative embodiment of the invention in which the base, emitter and collector electrodes are brought out on the same side of the device.

In Figs. 29 and 30 another hermetically sealed arrangement is shown wherein the base terminal is brought out on the same side of the device as the collector and emitter terminals. In this embodiment the base member 250 is provided with the opening 251 therein for a base electrode, which may be similar to the base electrode 60 described in detail above in connection with the embodiment shown in Figs. 2 to 10, inclusive. The base member 250 is also provided with a shallow depression 252 in the upper surface thereof and the transverse openings 253 and 254 for the emitter and collector electrodes in the manner identical to that described above in connection with the base member shown in Fig. 23. The emitter and collector and base electrodes are positioned within the base member 250 and a layer of semiconductive material of the opposite conductivity type is deposited within the depression 252 after which the member is positioned within the upper and lower cup shaped members 255 and 256. The member 256 is provided with three hollow tubular members 257, 258 and 259 which are adapted to receive the end portions of the pin electrodes which are positioned in the base member 250 so that all of the terminals of the device are brought out on the same side. The member 255 is provided with a tubular pinch off portion 260. However, it will be understood that no coil spring is required to connect the semiconductive layer to the member 255 since a separate base electrode is provided for this purpose. In other respects the embodiment shown in Figs. 29 and 30 is identical to that described above in connection with Figs. 23 to 28, inclusive.

While there have been described what are at present considered to be the preferred embodiments of the invention, it will be understood that various modifications may be made therein which are within the true spirit and scope of the invention as defined in the appended claims.

What is claimed as new and desired to be secured by Letters Patent of the United States is:

1. A semiconductor device comprising, a base member of insulating material having a plurality of openings extending therethrough, a first pin electrode positioned within one of said openings and having a head portion coated with a semiconductive material of one conductivity type, a second pin electrode positioned within another of said openings and having a head portion coated with a semiconductive material of said one conductivity type, a third pin electrode positioned within a third one of said openings, a layer of semiconductive material of the opposite conductivity type on said base member, said layer overlying the coatings of said one conductivity type on the head portions of said first and second electrodes and contacting said third electrode, and means for making electrical connections to each of said electrodes.

2. A semiconductor device comprising, a base member of insulating material, said member having a shallow depression in the top surface thereof and a plurality of openings extending from said depression transversely through said member, a pair of metallic pin electrodes positioned within a pair of said openings and each provided with a head portion coated with a thin layer of semiconductive material of one conductivity type, a third pin electrode positioned in another of said openings, a layer of semiconductive material of the opposite conductivity type on said base member, said layer covering the coated head portions of said pair of electrodes and contacting said third electrode, and means for making electrical connections to each of said electrodes.

3. A semiconductor device comprising, a base member of insulating material, said member having a shallow depression in the top surface thereof and a plurality of openings extending from said depression transversely through said member, a pair of metallic pin electrodes positioned within a pair of said openings and each provided with a head portion coated with a thin layer of semiconductive material of one conductivity type, a third pin electrode positioned in another of said openings, a layer of semiconductive material of the opposite conductivity type on said base member, said layer covering the coated head portions of said pair of electrodes and contacting said third electrode, a body of sealing compound filling said depression and sealing said last mentioned layer from the atmosphere, and means for making electrical connections to each of said electrodes.

4. A semiconductor device comprising, a base member of insulating material having a plurality of openings extending therethrough, each of said openings having an enlarged top opening portion, a pair of metallic pin electrodes each having an enlarged head portion, means for positioning said pin electrodes within a pair of said openings with the head portions thereof within the enlarged top portions of said openings, each of said pin electrodes having a thin layer of semiconductive material of one conductivity type on the upper surface of the load portion thereof, a third metallic pin electrode positioned in a third one of said openings, said third electrode having a head portion positioned within the enlarged top opening of said third opening, a layer of semiconductive material of the opposite conductivity type on the upper surface of said base member, said layer forming interfaces with the layers on the head portions of said pin electrode and contacting said third electrode, and means for making electrical connections to each of said electrodes.

5. A multiple unit semiconductor device comprising, a base member of insulating material, a plurality of groups of electrodes positioned on said base member and extending therethrough, each of said groups including a base electrode, an emitter electrode and a collector electrode, said electrodes having enlarged head portions positioned within corresponding recesses in said base member, said emitter and collector electrodes having a coating of semiconductive material of one conductivity type on the upper surface of the head portions thereof, a layer of semiconductive material of the opposite conductivity type on said base member connecting the electrodes of each of said groups overlying the coatings of said one conductivity type on said emitter and collector electrodes, and means for establishing electrical connections to said groups of electrodes.

6. A multiple unit semiconductor device comprising a base member of insulating material having a plurality of recesses in the upper surface thereof, a plurality of groups of electrodes positioned on said base member and extending therethrough, each of said groups being positioned in a different one of said recesses and including a base electrode, an emitter electrode and a collector electrode, said electrodes having enlarged head portions positioned within corresponding recesses in said base member, said emitter and collector electrodes having a coating of semiconductive material of one conductivity type on the upper surface of the head portions thereof, a layer of semiconductive material of the opposite conductivity type on said base member connecting the electrodes of each of said groups overlying the coatings of said one conductivity type on said emitter and collector electrodes, a layer of sealing compound in each of said recesses for protecting said last-named layer from the atmosphere, and means for making electrical connection to each of said electrodes.

7. A semiconductor device comprising, a base member of insulating material having a shallow depression in the upper surface thereof and having depending side wall portions defining a recess in the bottom thereof, a base electrode, an emitter electrode and a collector electrode positioned on said base member within said depression, said electrodes having enlarged head portions positioned within corresponding recesses in said base member and having shank portions extending into said recess, means for securing said shank portions to the side wall portions of said base member, the head portions of said emitter and collector electrodes having a coating of semiconductive material of one conductivity type thereon, and a layer of semiconductive material of the opposite conductivity type on said base member in intimate contact with the coating on said emitter and collector electrodes.

8. A semiconductor device comprising, a base member of insulating material, a first layer of semiconductive material of one conductivity type on said base member, a second layer of semiconductive material of the opposite conductivity type on said base member, a portion of said second layer overlapping said first layer, a third layer of semiconductive material of said one conductivity type on said base member, a portion of said third layer overlapping said first and second layers, and means for making electrical connection to said first, second and third layers.

9. The method of manufacturing a semiconductive device which comprises the steps of, depositing in a first predetermined area of a base member of insulating material a first layer of semiconductive material of one conductivity type, depositing in a second predetermined area on said member a second layer of semiconductive material of the opposite conductivity type, depositing in a third predetermined area on base member a layer of semiconductive material of said one conductivity type, at least a portion of said first, second and third areas overlapping one another, and simultaneously depositing a layer of contact material on said areas in the non-overlapping portions thereof to provide electrical contact portions therefor.

10. A semiconductor device comprising, a base member of insulating material having a plurality of openings extending therethrough, a pair of metallic pin electrodes positioned within a pair of said openings, a layer of semiconductive material of one conductivity type on the upper surface of said base member and covering the head portions of said pin electrodes, the head portions of said pin electrodes adjacent said layer being diffused into said layer to form zones of the opposite conductivity type, and means for making electrical connections to said electrodes and said layer.

11. A semiconductor device comprising, a base member of insulating material having a plurality of openings extending therethrough, a pair of metallic pin electrodes positioned within a pair of said openings, a layer of semiconductive material of one conductivity type on the upper surface of said base member and covering the head portions of said pin electrodes, the head portions of said pin electrodes adjacent said layer being diffused into said layer to form zones of the opposite conductivity type, and means for making electrical connections to said electrodes and said layer, said last named means including a base electrode positioned in one of said openings and formed of a metal which does not react with said layer to produce a zone of the opposite conductivity type when subjected to heat.

12. A semiconductor device comprising, a base member of insulating material having a plurality of openings extending therethrough, a pair of metallic pin electrodes positioned within a pair of said openings, a layer of semiconductive material on said base member and covering the head portions of said pin electrodes, the head portions of said pin electrodes adjacent said layer being diffused into said layer to form zones of the opposite conductivity type, as metal casing surrounding said base member and having a wall of insulating material, a pair of terminal members extending through said insulating wall, means connecting the ends of said pin electrodes to said terminal members inside said casing, and means for connecting said layer to said metal casing, said casing being evacuated to protect said device.

13. A semiconductor device comprising, a base member of insulating material, said member having a shallow depression in the top surface thereof and a plurality of openings extending therethrough, a pair of metallic pin electrodes positioned within a pair of said openings and each provided with a head portion coated with a thin layer of semiconductive material of one conductivity type, a layer of semiconductive material of the opposite conductivity type in said shallow depression and covering the coated head portions of said pair of electrodes, a metal casing enclosing said base member and having a wall of insulating material, a pair of terminal members extending through said insulating wall, means connecting the ends of said pin electrodes to said terminal members inside said casing, and means including a coil spring positioned in said shallow depression in engagement with said layer for connecting said layer to said casing, said casing being evacuated to protect said device.

14. A semiconductor device comprising, a base member of insulating material, said member having a shallow depression in the top surface thereof and a plurality of openings extending from said depression transversely through said member, a pair of metallic pin electrodes positioned within a pair of said openings and each provided with a head portion coated with a thin layer of semiconductive material of one conductivity type, a third pin electrode positioned in another of said openings, a layer of semiconductive material of the opposite conductivity type on said base member, said layer covering the coated head portions of said pair of electrodes and contacting said third electrode, a metal casing enclosing said base member and having a wall of insulating material, a plurality of terminal members extending through said insulating wall, and means individually connecting the ends of said first, second and third electrodes to said terminal members inside said casing, said casing being evacuated to protect said device.

References Cited in the file of this patent

UNITED STATES PATENTS

| | | |
|---|---|---|
| 2,629,802 | Pantchechnikoff | Feb. 24, 1953 |
| 2,650,258 | Pantchechnikoff | Aug. 25, 1953 |
| 2,657,345 | Stuetzer | Oct. 27, 1953 |